(12) United States Patent
Beck

(10) Patent No.: US 8,743,521 B2
(45) Date of Patent: Jun. 3, 2014

(54) PHOTOVOLTAIC SYSTEM WITH OVERVOLTAGE PROTECTION

(75) Inventor: Bernhard Beck, Dimbach (DE)

(73) Assignee: Adensis GmbH, Dresden (DE)

( * ) Notice: Subject to any disclaimer, the term of this patent is extended or adjusted under 35 U.S.C. 154(b) by 62 days.

(21) Appl. No.: 13/447,598

(22) Filed: Apr. 16, 2012

(65) Prior Publication Data

US 2012/0261996 A1 Oct. 18, 2012

(30) Foreign Application Priority Data

Apr. 16, 2011 (DE) .......................... 10 2011 017 362

(51) Int. Cl.
*H02H 3/00* (2006.01)
(52) U.S. Cl.
USPC ............................................ 361/88; 361/91.1
(58) Field of Classification Search
None
See application file for complete search history.

(56) References Cited

U.S. PATENT DOCUMENTS

| | | | |
|---|---|---|---|
| 8,138,411 B2 | 3/2012 | Beck et al. | |
| 2003/0010373 A1* | 1/2003 | Tsuzuki et al. | ............... 136/244 |

FOREIGN PATENT DOCUMENTS

| | | |
|---|---|---|
| DE | 20 2006 008 936 U1 | 9/2006 |
| DE | 10 2010 017 747 A1 | 11/2011 |
| EP | 2 086 020 A2 | 8/2009 |
| EP | 2 101 391 A2 | 9/2009 |

OTHER PUBLICATIONS

DE102010017747 with Drawings Google Translation, Gerd et al., "Photovoltaic System", Nov. 3, 2011.*
WO2010043343 Google Translation, Thomas Freyermuth, "Solar Module" Apr. 22, 2010.*

* cited by examiner

*Primary Examiner* — Jared Fureman
*Assistant Examiner* — Terrence Willoughby
(74) *Attorney, Agent, or Firm* — Muncy, Geissler, Olds & Lowe, P.C.

(57) ABSTRACT

A photovoltaic system having a photovoltaic generator, whose strings with series-connected photovoltaic modules have a positive pole and a negative pole, and with an inverter whose DC input is connected to the two poles. The voltage of the positive pole and/or of the negative pole is measured with respect to ground, and a first switching element located between the positive pole and the DC input of the inverter and/or a second switching element located between the negative pole and the DC input of the inverter is opened, while a third switching element located between the positive pole and the negative pole is closed, when the voltage of the positive pole or of the negative pole exceeds a predefined first or second limit value.

19 Claims, 1 Drawing Sheet

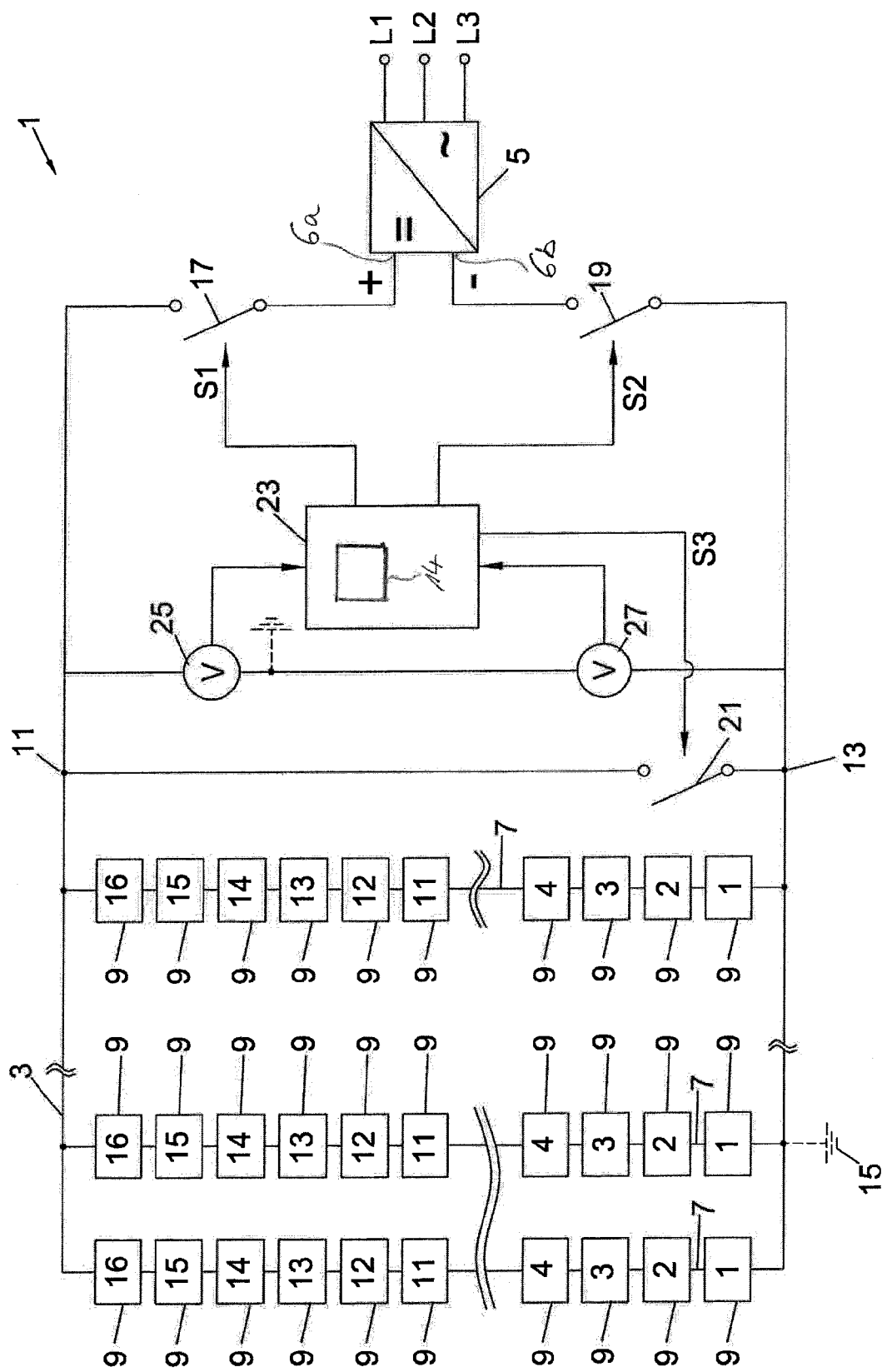

PHOTOVOLTAIC SYSTEM WITH OVERVOLTAGE PROTECTION

This nonprovisional application claims priority under 35 U.S.C. §119(a) to German Patent Application No. DE 10 2011 017 362.5, which was filed in Germany on Apr. 16, 2011, and which is herein incorporated by reference.

BACKGROUND OF THE INVENTION

1. Field of the Invention

The invention relates to a photovoltaic system with a photovoltaic generator, which comprises multiple parallel strings of series-connected photovoltaic modules, wherein the strings have a positive pole and a negative pole, between which is present a predetermined string voltage over the number of series-connected photovoltaic modules, and with an inverter whose DC input is connected to the two poles and whose AC output can be connected to a supply grid. The invention also relates to a method for operating such a photovoltaic system.

2. Description of the Background Art

A photovoltaic system is known from EP 2 086 020 A2, which corresponds to U.S. Pat. No. 8,138,411, and which is incorporated herein by reference.

When designing a photovoltaic system, care must be taken to ensure that the maximum permissible voltage ($U_z$) between the positive pole and the negative pole on the DC side of the inverter is not exceeded. The reason for this is that an exceedance results in destruction of the inverter and the part of the photovoltaic modules at which a voltage above a permissible voltage is present.

For this reason, the photovoltaic system customarily is designed such that even in the most unfavorable case of a no-load condition, the string voltage, which is then referred to as the no-load voltage or open-circuit voltage ($U_L$), remains below the maximum permissible string voltage ($U_z$). In a design with a plurality of parallel-connected strings, the maximum number of strings is determined by the output of the inverter to which the strings are connected. In this context, the inverter can be designed for a DC input voltage of approximately 900V to 1000V.

In an implementation of the photovoltaic system (PV system) with 11 photovoltaic modules (PV modules) in each string, each of which has 120 photovoltaic cells (PV cells), a total of 1320 cells are thus connected in series with one another. A voltage of 0.75V is present at each cell in the no-load condition, resulting in a string voltage of 990V. This value is below the maximum voltage of 1000V specified by the manufacturers of the PV modules.

During operation of the PV system, the open-circuit voltage of the PV cells drops to an operating voltage of approximately 0.5V so that a voltage of 660V is present between the ends of the conventional strings. If the PV system should be taken off the grid unexpectedly, for example due to a short circuit in the supply cable, then the voltage abruptly jumps to the said 990V, which is not critical for the PV modules and the PV system. However, if a higher voltage is present, this can lead to destruction of at least some PV modules and of the inverter as well as the entire PV system.

Now, on the one hand it is desirable, especially with regard to new types of PV modules with relatively high rated voltages and open-circuit voltages, to operate the PV modules and also the inverters at a higher voltage than 660V in normal operation, ideally at the maximum permissible voltage of 1000V. For better utilization of the dielectric strength of the cabling, generally 1000V, it is additionally desirable to increase the number of PV modules per string in order to utilize the 1000V voltage during operation of the PV system. This is not readily possible, however, since a voltage of approximately 1500V in the no-load condition would then lead to the destruction of the PV modules and the inverter as well as the system.

To avoid these impermissibly high voltages, it is known from EP 2 101 391 A2 to arrange a short-circuit switch between the positive pole and the negative pole that short circuits the poles in the event of an impermissibly high voltage between them. In addition, it is known from EP 2 086 020 A2, mentioned earlier, and from DE 20 2006 008 936 U1 to fix the positive pole or the negative pole at a fixed, permissible voltage of, for example, the said 1000V and to allow the PV system to float up or down from this voltage in operation, which is referred to as floating.

This measure is not possible for PV systems with a free floating voltage. In PV systems with a free floating voltage of the positive pole and of the negative pole, voltages of, e.g., plus (+) 600V to minus (−) 600 volts occur with respect to a virtual ground. Virtual ground here means that the strings are not connected to ground at any point. However, if the center of the string is placed at ground, then corresponding voltages of (+) 600V and (−) 600V with respect to the grounded center of the string would be present at the positive and negative poles, respectively.

For such PV systems, it is possible to provide a switch between the center of the string and ground that is closed in the event of a ground fault and actually grounds the center of the string. As a result, then, only voltages of up to 600V occur at the PV modules. However, this measure entails substantial cabling effort, since the center of every single string must be reachable through the switches. Moreover, when the modules known as TCO modules are used, corrosion problems occur, because the edge of the modules is eroded on account of cathode discharge.

SUMMARY OF THE INVENTION

It is therefore an object of the invention to provide a suitable method for operating a photovoltaic system and to provide a photovoltaic system having a free floating or freely offsettable voltage with overvoltage protection. On the one hand, operation with a high operating voltage of, e.g., 1500V should be made possible here, and on the other hand it should be ensured that no impermissible voltage exceedances occur at a PV module or at the input of the inverter.

To this end, a positive pole is connected to the DC input of the inverter by a first switching element, and a negative pole by a second switching element, and the two poles are connected by a third switching element. A measurement system that measures the voltage of the positive pole and/or of the negative pole with respect to ground is connected to a controller that, using the measured voltage, generates a first control signal for opening the first switching element or a second control signal for opening the second switching element and a third control signal for closing the third switching element, when the voltage at one of the two poles exceeds a limit value.

The string voltage of the photovoltaic generator is greater than 1000V in the no-load condition (open circuit string voltage). The predefined limit value with respect to the negative pole is at least 3% smaller in terms of absolute value than a lowest operating point voltage in the control algorithm of an MPP regulator. A special aspect of the invention is that the connection of the positive pole and negative pole on the DC side with respect to the inverter is free of short-circuit switching elements with the exception of the third switching element.

At least one of the two switching elements can be opened by means of the controller when the voltage of the positive pole with respect to ground exceeds the first limit value, or when the voltage of the negative pole with respect to ground exceeds the second limit value in terms of absolute value. The controller closes the third switching element and thereby connects the positive pole and negative pole to one another, while the first or the second switching element opens, or when at least one of these switching elements is open. With respect to the negative pole, the second predefinable limit value is to be viewed in terms of absolute value and thus as an unsigned quantity. This means that a voltage of (−)1050V with respect to ground is greater than (−)1000 V in terms of absolute value.

This method according to the invention for overvoltage protection of the PV system ensures that no impermissibly high voltage ($U_z$) with respect to ground arises in the no-load condition at the components of the PV system, in particular at the PV modules and at the inverter. Because of the high operating voltage of, e.g., 1000V under load, it is also possible for cables with relatively small conductor cross-sections to be used for the same output of the PV system, which is economical and allows relatively large PV systems. The inverter itself can be operated at its maximum voltage. In this way, better utilization of the dimensioning is achieved, in particular of the voltage rating of the installed capacitors and the electronic components, as well as the wiring, of the inverter.

In an embodiment, the first or the second limit value can be at least 3% smaller in terms of absolute value than the lowest permissible voltage rating of all voltage-carrying components involved, as for example a terminal or a cable of the photovoltaic module. Thus, the short-circuit connection is based on the weakest element, which generally is the photovoltaic module. In the case of older, retrofitted PV systems, other components may also be affected in this regard, however.

The second limit value can be at least 3% smaller in terms of absolute value than the lowest operating point voltage defined in the control algorithm of the MPP regulator of the photovoltaic system. When TCO photovoltaic modules are used, with their problematic cathode erosion under negative voltage, this prevents these TCO modules from continuing to operate and damaging themselves.

The substantially simultaneous opening of the first and second switching elements is advantageous with regard to protection of the capacitors and electronic components in the inverter. Initiation of the process of closing the third switching element together with the process of opening the first and/or second switching element is achieved in particular by the means that all three switching elements have a common drive. This measure ensures that the process of closing the third switching element does not take place before the process of opening has progressed at least far enough that the arc produced in the first two switching elements because of the high DC current present has absorbed a majority of the energy otherwise flowing in the direction of the inverter. Ideally, the drive is positively driven mechanically such that during the presence of the arc across the switch contacts of the first, and if applicable the second switching element, the process of closing the third switching element has advanced far enough that the meeting of the contacts takes place immediately before or after the extinction of the arc or of each arc.

In an embodiment, all switching elements can be designed for one-time use. Thus, the intent in an embodiment is only to deal with an unlikely and rather rare event in which the grid side of the inverter has suddenly failed or in which a ground fault is present on the photovoltaic generator side. Depending on the quality or load-carrying capability of the ground fault, it can have the result that all of the energy stored in the capacitors of the inverter—possibly increased by the energy flowing out of the supply grid toward the inverter—is directed into the photovoltaic generator. As an alternative to the one-time switch, a switch that can be reset by hand is also a possibility.

The photovoltaic system can include a photovoltaic generator, which in turn comprises multiple parallel strings of series-connected photovoltaic modules. The strings have a positive pole and a negative pole, wherein a string voltage is present between the poles that is predetermined or can be predetermined over the number of series-connected photovoltaic modules. An inverter, the DC input of which is connected to the two poles, can be connected on the output side to, for example, a three-phase supply grid.

According to an embodiment of the invention, the voltage of the positive pole and/or of the negative pole can be measured with respect to ground. Based on the measured voltage, a first switching element located between the positive pole and the DC input of the inverter and/or a second switching element located between the negative pole and the DC input of the inverter is opened. In addition, a third switching element located between the positive pole and the negative pole is closed when the voltage of the positive pole exceeds a first predefined limit value or the voltage of the negative pole exceeds a second predefined limit value.

In an embodiment, the voltage of the positive pole and/or of the negative pole with respect to ground can be measured by means of a measurement system, and the measured voltage is delivered to a controller connected to the measurement system. Based on the measured voltage, the controller generates a first control signal and/or a second control signal and also a third control signal, wherein the first switching element is opened by means of the first control signal and the second switching element is opened by means of the second control signal.

The process of closing the third switching element by means of the third control signal can be initiated simultaneously or substantially simultaneously with the opening of the first switching element and/or of the second switching element. In addition, the first switching element and the second switching element are opened substantially simultaneously in useful fashion. Moreover, the third switching element suitably can be opened simultaneously or substantially simultaneously with the process of opening the first switching element or the second switching element.

In a photovoltaic generator operated with a free floating voltage, the first limit value and/or the second limit value can be at least one half of the string voltage (Us) in the no-load condition (open-circuit string voltage ($U_L$).

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawing which are given by way of illustration only, and thus, are not limitive of the present invention, and wherein the sole FIGURE here shows a schematic diagram of a PV system according to the invention with three switching elements on the DC side of an inverter.

DETAILED DESCRIPTION

The photovoltaic system (PV system) 1 shown schematically in the FIGURE comprises, as important elements, a photovoltaic generator (PV generator) 3 and an inverter 5. The inverter 5 is connected on the AC side or output side to a three-phase supply grid L1, L2, L3, and has, on the DC side, a positive (+) DC input 6a and a negative (−) DC input 6b. The PV generator 3 comprises a number of parallel-connected strings 7, each of which includes a series connection of sixteen (16) photovoltaic modules (PV modules) 9. The ends 11 and 13 of the strings 7 constitute a positive pole or a negative pole.

If the PV module 9 from the example discussed above has one hundred twenty (120) cells, each of which has a cell-specific operating or string voltage $U_z$ of 0.5V and a cell-specific open-circuit voltage $U_L$ of 0.75 volts, then the result for each string 7 with its sixteen (16) PV modules 9 is a string-specific open-circuit voltage (open-circuit string voltage) $U_L$ of 1440V between the positive pole 11 and the negative pole 13. During operation of the PV generator 3, an operating or string voltage $U_z$ of 960V is then established between the poles. This operating voltage $U_z$ is not critical for the PV modules 9 and the inverter 5, and makes good use of the permissible voltage limit of 1000V.

In a planned disconnection of the PV generator 3 from the supply grid L1, L2, L3, suitable measures on the part of an MPP regulator (Maximum Power Point) 14 are used to prevent the open-circuit voltage $U_L$ of 1440V, which could lead to damage, from being present at the PV modules 9 and the DC inputs 6a, 6b of the inverter 5. However, if power output at the AC side of the inverter 5 remains absent, the input voltage at the DC side of the inverter 5 abruptly jumps to the value of the open-circuit voltage $U_L$ of 1440 V, which should be avoided.

A different, unplanned voltage increase may occur as a result of a ground fault or ground leakage 15 that arises at one of the connecting lines between the PV modules 9, the connecting lines between the strings 7, or the connecting lines to the inverter 5. Such a ground fault 15 is symbolized in the FIGURE by a ground symbol drawn with dashed lines. For better comprehensibility, the ground fault 15 is drawn at the bottom at the first PV module 9. In principle, at any other location the ground fault 15 results in the same effect, albeit more subtly.

As a general rule, the ground fault 15 is not a short circuit capable of carrying a load, instead causing a reduced transition resistance to ground, but one that is sufficient to offset the voltage at this point. The voltage offset has the result that the negative pole 13 no longer floats freely in the no-load condition, but instead is displaced toward ground. For reasons of clarity, a ground fault that is not capable of being loaded with current is assumed. If a no-bad condition occurs now, an open-circuit voltage $U_L$ of 90V would build up at the first PV module 9 at the bottom, an open-circuit voltage $U_L$ of 180 volts at the second PV module 9 above it, an open-circuit voltage $U_L$ of three times 90V, which is to say 270V, at the third PV module 9, etc. The module voltage increases by 90V from PV module 9 to PV module 9, which results in an impermissible open-circuit voltage $U_L$ of 1080V as of the twelfth module.

This is where the overvoltage protection according to the invention comes into play, in that a first switching element 17 is connected between the positive DC input 6a (+) of the inverter 5 and the positive pole 11 of the PV generator 3. In analogous fashion, a second switching element 19 is connected between the negative DC input 6b (−) of the inverter 5 and the negative pole 13 of the PV generator 3. During normal, fault-free operation of the PV system 1, both switching elements 17, 19 are closed and connect the DC side of the inverter 5 with the positive pole 11 or with the negative pole 13 of the PV generator 3.

On the DC side of the inverter, a third switching element 21 follows the switching elements 17 and 19, and is connected in parallel with the first and second switching elements 17 and 19. In the closed state, the third switching element 21 connects the positive pole 11 and the negative pole 13 to one another, and thus shortcircuits the PV generator 3. The third switching element 21 is open in the fault-free operating state of the PV system 1 so that the photovoltaically generated DC current flows to the inverter 5.

The switching elements 17, 19, and 21 are controlled by means of control signals S1, S2, and S3 that are generated by a controller 23. Supplied to the controller 23 as input signals are the voltage value present at the positive pole 11 with respect to ground that is measured by a first measuring instrument 25 connected to the positive pole 11, and the voltage value present at the negative pole 13 with respect to ground that is measured by a second measuring instrument 27 connected to the negative pole 13. Instead of two measuring instruments 25, 27, it is also possible to use one measurement system, which simultaneously or substantially simultaneously and/or individually measures the voltage present at the positive pole 11 and at the negative pole 13 with respect to ground.

During the course of overvoltage protection, the first measuring instrument 25 measures a voltage value above a limit value G1 of, e.g., 1000V, which is detected by the controller 23, which thereupon sends the switching signals 51, S2 to the first switching element 17 and/or the second switching element 19, causing them to open. Mechanical switching elements 17, 19, 21 are used that initiate the actual opening process of disconnecting the switch contacts from one another within a certain period of time in a manner dictated by the design. Because of the large DC current of up to several hundred amps that is flowing, an arc forms at each of the two switching elements 17, 19 when the switch contacts are disconnected from one another, which converts the energy of the DC current into an ionized gas or a plasma.

Substantially simultaneously with the opening of the first and second switching elements 17 and 19, the closing process is initiated for the third switching element 21. On condition that the third switching element 21 has switching behavior that is identical to the first and second switching elements 17 and 19, the switch contacts of all three switching elements 17, 19, 21 will have traveled the same distance immediately after starting of the contact motion of the first and of the second switching element 17 and 19 in the opening direction, and of the third switching element 21 in the closing direction. This means that an arc is present at the first switching element 17 and at the second switching element 19, and the spacing of the switch contacts of the third switching element 21 is not yet small enough to ignite an arc. This situation changes during the further course of the switch contact motions, wherein the plasma column of the arcs of the first and second switching element 17 or 19 becomes progressively narrower, and the spacing of the switch contacts of the third switching element 21 becomes sufficiently small that an arc also arises there during the closing process.

This procedure permits an extraordinarily fast-acting, rapid disconnection of the PV generator 3 from the inverter 5 and hence from the supply grid L1, L2, L3. After the completion of all switch contact motions, the PV generator 3 is short-circuited and has no electrical connection to the supply grid L1, L2, L3, so that none of the components involved of the PV generator 3, such as binding clips, cables, cable branchings, cable lugs, photovoltaic modules, carries a voltage.

It is also possible to generate the first and second switching signals S1 and S2 on the one hand, and the third switching signal S3 on the other hand, in a timeshifted manner in order to achieve an optimum point in time between the process of opening the first and second switching elements 17, 19 and the process of opening the third switching element 21.

The switching elements 17, 19, 21 can operate on an electrical, electronic, and/or mechanical basis, for example also as a hybrid switch, and can be IGBTs, for example. In particular, it is possible to take into account in the dimensioning of all switching elements 17, 19, 21 that they are designed for one-time use, especially since the use of the corresponding safety mechanism for overvoltage protection is to be expected only in a rare failure case. It is advantageous for all three switching elements 17, 19, 21 to have a common drive, especially when the drive is positively driven.

The first limit value G1 and the second limit value G2 can be adjusted through means, which are not shown, at the controller 23. Predetermined limit values G1, G2 may also be used that are permanently preprogrammed in the controller 23 and compared with the measured values from the first and second measuring instruments 25 and 27.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A photovoltaic system comprising:
   a photovoltaic generator that comprises multiple parallel strings of series connected photovoltaic modules, the strings having a positive pole and a negative pole between which is present a predetermined string voltage over a number of series-connected photovoltaic modules;
   an inverter configured to be connectable on an output side to a supply grid and whose DC input is connectable to the positive pole and the negative pole;
   a first switching element configured to connect the positive pole to the DC input of the inverter;
   a second switching element configured to connect the negative pole to the DC input of the inverter;
   a third switching element configured to connect the positive pole and the negative pole;
   a measurement system configured to measure a voltage of the positive pole and/or of the negative pole with respect to ground; and
   a controller connectable to the measurement system, the controller, using the measured voltage, generates a first control signal for opening the first switching element and/or a second control signal for opening the second switching element and also generates a third control signal for closing the third switching element when the voltage of the positive pole exceeds a first predefined limit value or the voltage of the negative pole exceeds a second predefined limit value;
   wherein, substantially simultaneously with the opening of the first switching element and/or of the second switching element, a process of closing the third switching element via the third control signal is initiated.

2. The photovoltaic system according to claim 1, wherein a string voltage in a no-load condition of the photovoltaic generator is greater than 1000V.

3. The photovoltaic system according to claim 1, further comprising a maximum power point regulator (MPP) regulator, wherein the second predefined limit value is at least 3% smaller than a lowest operating point voltage in a control algorithm of the MPP regulator.

4. The photovoltaic system according to claim 1, wherein a connection of the positive pole and negative pole on the DC side with respect to the inverter is free of switching elements with the exception of the third switching element.

5. The photovoltaic system according to claim 1, wherein in the closed state, the third switching element connects the positive pole and the negative pole to one another to thereby short-circuit the photovoltaic generator.

6. The photovoltaic system according to claim 1, wherein, when the third switching element is open, the photovoltaically generated DC current flows to the inverter.

7. The photovoltaic system according to claim 1, wherein, after the completion of all switch contact motions, the photovoltaic generator is short-circuited and has no electrical connection to the supply grid.

8. The photovoltaic system according to claim 1, wherein the connection of the positive pole and negative pole on the DC side with respect to the inverter is free of short-circuit switching elements with the exception of the third switching element.

9. The photovoltaic system according to claim 1, wherein the photovoltaic module has a plurality of cells, each of which has a cell-specific operating or string voltage of 0.5V and a cell-specific open-circuit voltage of 0.75 volts.

10. A method for operating a photovoltaic system having a photovoltaic generator, which comprises multiple parallel strings of series-connected photovoltaic modules, wherein the strings have a positive pole and a negative pole, between which is present a predetermined string voltage over a number of series-connected photovoltaic modules, and having an inverter whose DC input is connected to the two poles and that is connectable on an output side to a supply grid, the method comprising:
   measuring the voltage of the positive pole and/or of the negative pole with respect to the ground; and
   using the measured voltage, a first switching element located between the positive pole and the DC input of the inverter and/or a second switching element located between the negative pole and the D C input of the inverter is opened, and a third switching element located between the positive pole and the negative pole is closed, when the voltage of the positive pole exceeds a first predefined limit value or the voltage of the negative pole exceeds a second predefined limit value;
   wherein, substantially simultaneously with the opening of the first switching element and/or of the second switching element, a process of closing a third switching element via a third control signal is initiated.

11. The method according to claim 10, wherein the photovoltaic generator is operated with a free floating voltage, wherein the first limit value and/or the second limit value is at least one half of the string voltage in a no-load condition.

12. The method according to claim 10, wherein the first switching element and the second switching element are opened substantially simultaneously.

13. The method according to claim 10, wherein the third switching element is opened substantially simultaneously with the opening of the first switching element or the second switching element.

14. The method according to claim 10, wherein in the closed state, the third switching element connects the positive pole and the negative pole to one another to thereby short-circuit the photovoltaic generator.

15. The method according to claim 10, wherein, when the third switching element is open, the photovoltaically generated DC current flows to the inverter.

16. The method according to claim 10, wherein after the completion of all switch contact motions, the photovoltaic generator is short-circuited and has no electrical connection to the supply grid.

17. The method according to claim 10, wherein the connection of the positive pole and negative pole on the DC side with respect to the inverter is free of short-circuit switching elements with the exception of the third switching element.

18. The method according to claim 10, wherein the photovoltaic module has a plurality of cells, each of which has a cell-specific operating or string voltage of 0.5V and a cell-specific open-circuit voltage of 0.75 volts.

19. A method for operating a photovoltaic system having a photovoltaic generator, which comprises multiple parallel strings of series-connected photovoltaic modules, wherein the strings have a positive pole and a negative pole, between which is present a predetermined string voltage over a number of series-connected photovoltaic modules, and having an inverter whose DC input is connected to the two poles and that is connectable on an output side to a supply grid, the method comprising:

measuring the voltage of the positive pole and/or of the negative pole with respect to the ground; and using the measured voltage, a first switching element located between the positive pole and the DC input of the inverter and/or a second switching element located between the negative pole and the DC input of the inverter is opened, and a third switching element located between the positive pole and the negative pole is closed, when the voltage of the positive pole exceeds a first predefined limit value or the voltage of the negative pole exceeds a second predefined limit value;

wherein the voltage of the positive pole and/or of the negative pole with respect to ground is measured by a measurement system, wherein the measured voltage is delivered to a controller connectable to the measurement system, wherein, using the measured voltage, the controller generates a first control signal and/or a second control signal and also a third control signal, wherein the first switching element or the second switching element is opened via the first control signal or the second control signal, and wherein, substantially simultaneously with the opening of the first switching element and/or of the second switching element, a process of closing the third switching element via the third control signal is initiated.

* * * * *